United States Patent [19]

Shirai et al.

[11] Patent Number: 5,191,401
[45] Date of Patent: Mar. 2, 1993

[54] MOS TRANSISTOR WITH HIGH BREAKDOWN VOLTAGE

[75] Inventors: Koji Shirai, Kawasaki; Ken Kawamura, Yokohama, both of Japan

[73] Assignee: Kabushiki Kaisha Toshiba, Kawasaki, Japan

[21] Appl. No.: 789,444

[22] Filed: Nov. 7, 1991

Related U.S. Application Data

[63] Continuation of Ser. No. 491,084, Mar. 9, 1990, abandoned.

[30] Foreign Application Priority Data

Mar. 10, 1989 [JP] Japan .................................. 1-56103

[51] Int. Cl.$^5$ ............................................ H01L 27/02
[52] U.S. Cl. .................................. 257/328; 257/335; 257/336; 257/344; 257/401
[58] Field of Search ...................... 357/42, 41, 12, 48, 357/23.13, 23.8, 13, 23.3, 23.4

[56] References Cited

U.S. PATENT DOCUMENTS

| | | | |
|---|---|---|---|
| 3,787,962 | 1/1974 | Yoshida et al. | 437/29 |
| 4,143,392 | 3/1979 | Mylroie | 357/48 X |
| 4,300,150 | 11/1981 | Colak | 357/13 |
| 4,422,089 | 12/1983 | Vaes et al. | 357/23.4 |
| 4,626,879 | 12/1986 | Colak | 357/23.8 |
| 4,860,072 | 8/1989 | Zommer | 357/23.8 |
| 4,881,112 | 11/1989 | Matsushita | 357/12 X |

FOREIGN PATENT DOCUMENTS

| | | |
|---|---|---|
| 0080740 | 6/1983 | European Pat. Off. . |
| 0248292 | 12/1987 | European Pat. Off. . |
| 58-106871 | 6/1983 | Japan . |

OTHER PUBLICATIONS

Proceedings of the Symposium on High Voltage and Smart Power Devices, W. G. Meyer et al., AT&T-Ball Labe, pp. 60–69.

"D/CMOS Technology: Smartpower Processes that Solve Difference Circuit Design Problems," R. A. Blanchard et al., ELECTRO 86, pp. 73–77, 1986.

Primary Examiner—William Mintel
Assistant Examiner—Roy Potter
Attorney, Agent, or Firm—Finnegan, Henderson, Farabow, Garrett and Dunner

[57] ABSTRACT

A semiconductor device comprises a semiconductor substrate of a first conductivity type, a first well of a second conductivity type formed on the semiconductor substrate of the first conductivity type, a first impurity diffusion layer of the first conductivity type formed on the well without contacting the semiconductor substrate, a second impurity diffusion layer of the second conductivity type which surrounds the first impurity diffusion layer and has an impurity concentration which is higher than that of the first impurity diffusion layer, a third impurity diffusion layer of the first conductivity type formed within the second impurity diffusion layer so as to contact neither the semiconductor substrate nor the first impurity diffusion layer, a source electrode connected to both the second impurity diffusion layer and the third impurity diffusion layer, a gate electrode which is formed between the first impurity diffusion layer and the third impurity diffusion layer and formed on the second impurity diffusion layer so as to interpose an insulation film therebetween, a drain electrode connected to the first impurity diffusion layer, and a wiring layer extracted from the drain electrode outside the semiconductor substrate.

14 Claims, 7 Drawing Sheets

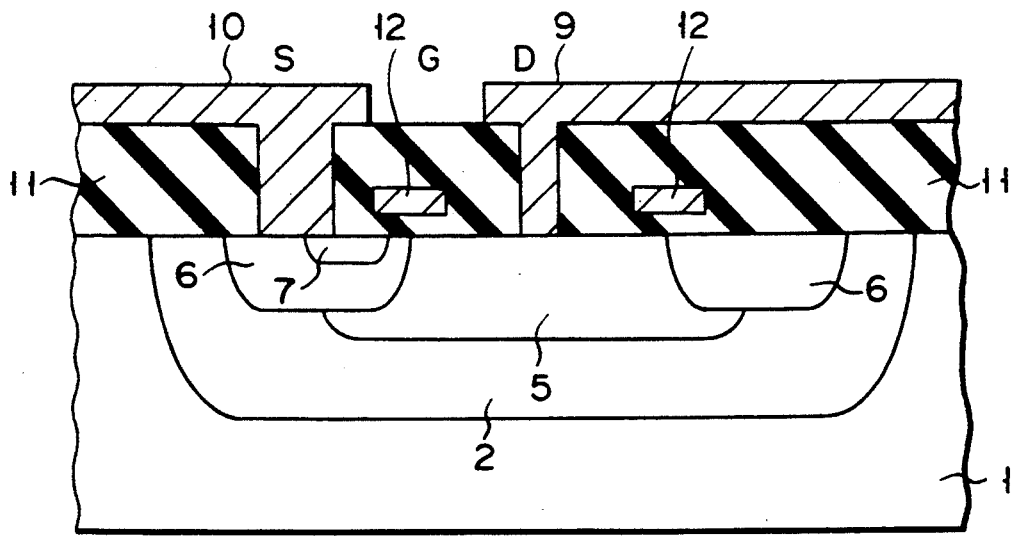
F I G. 1A
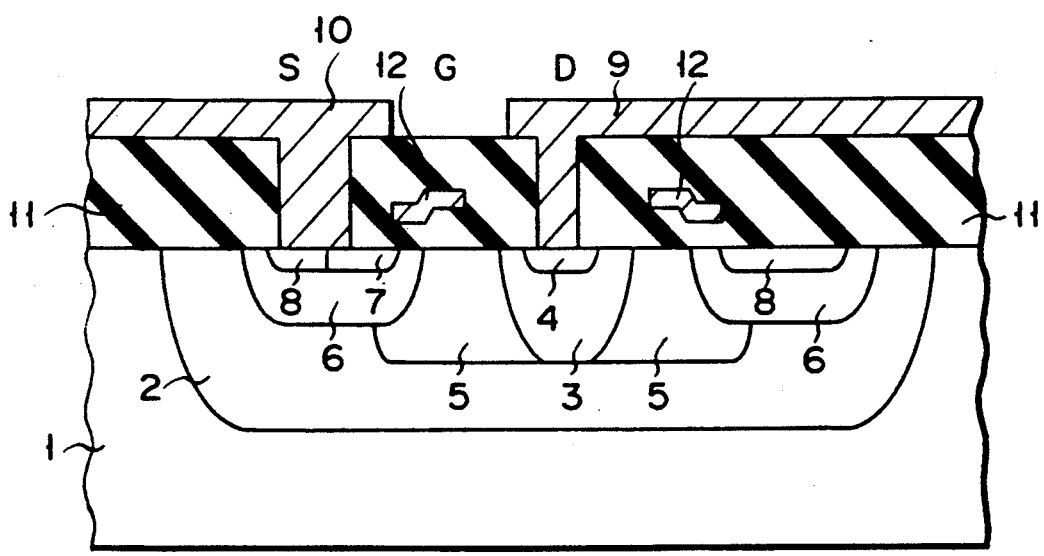
F I G. 1B

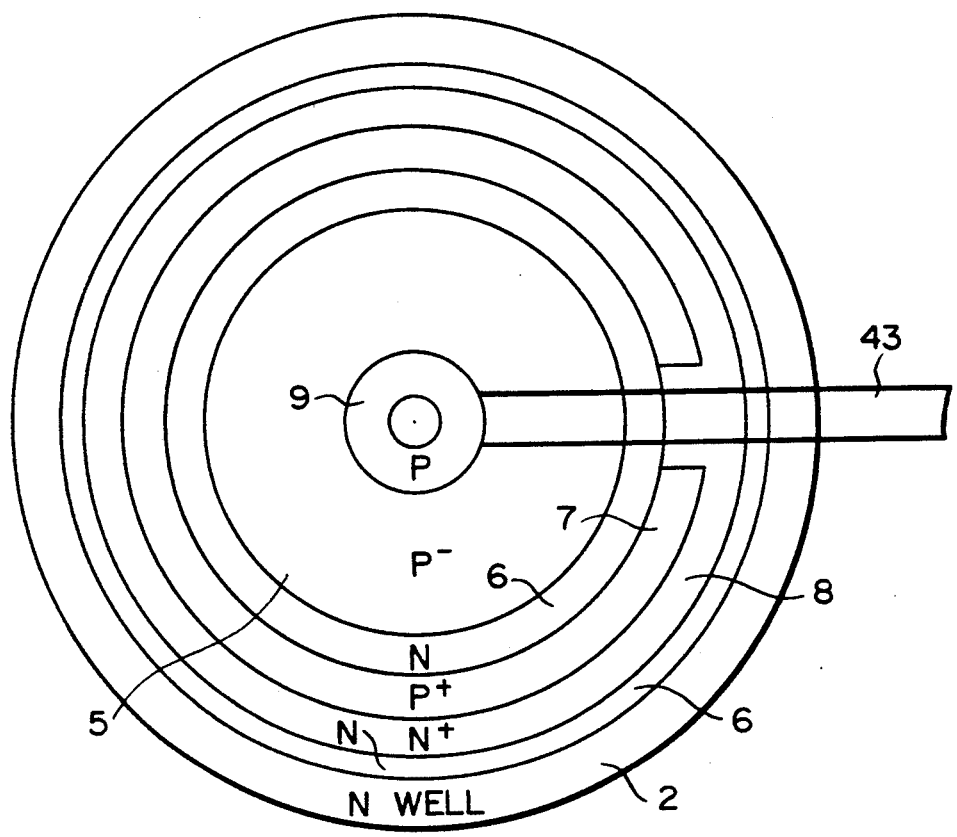
F I G. 1C
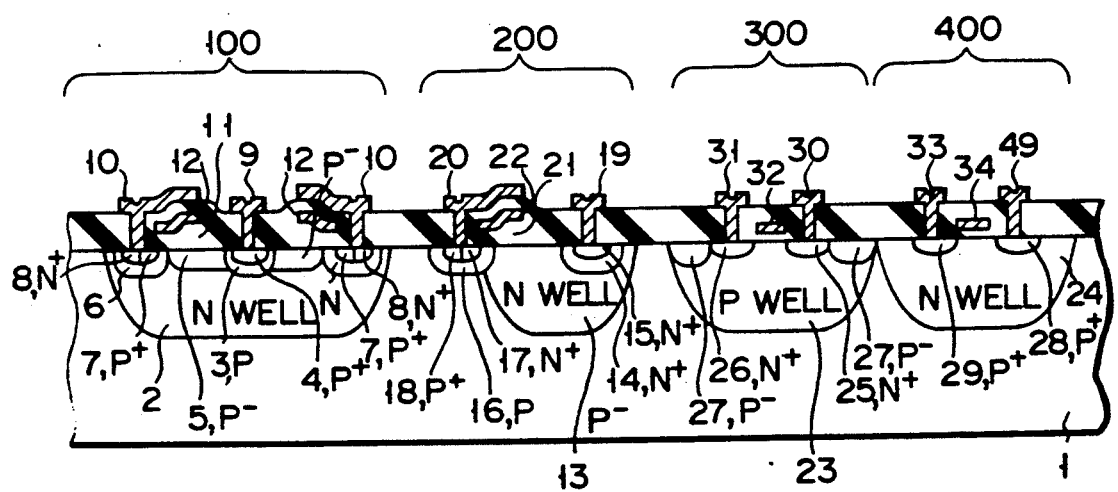
F I G. 2

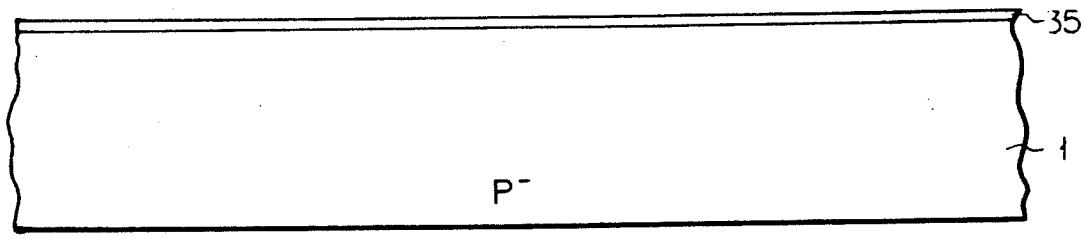
F I G. 3A
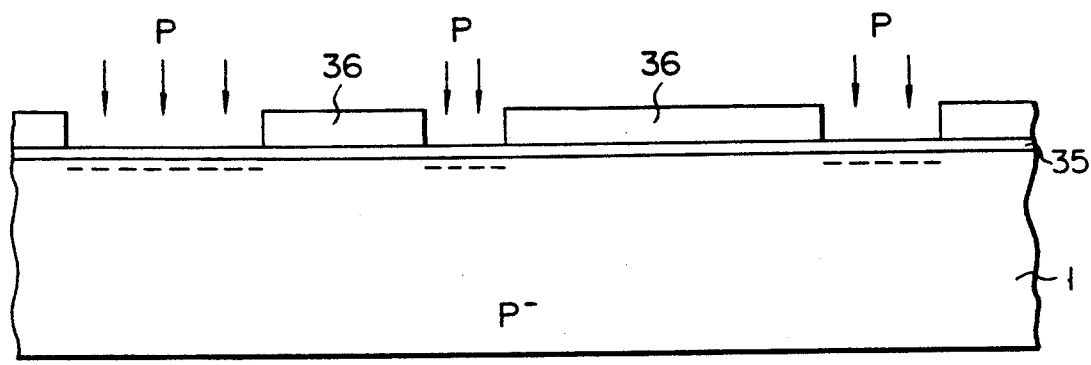
F I G. 3B
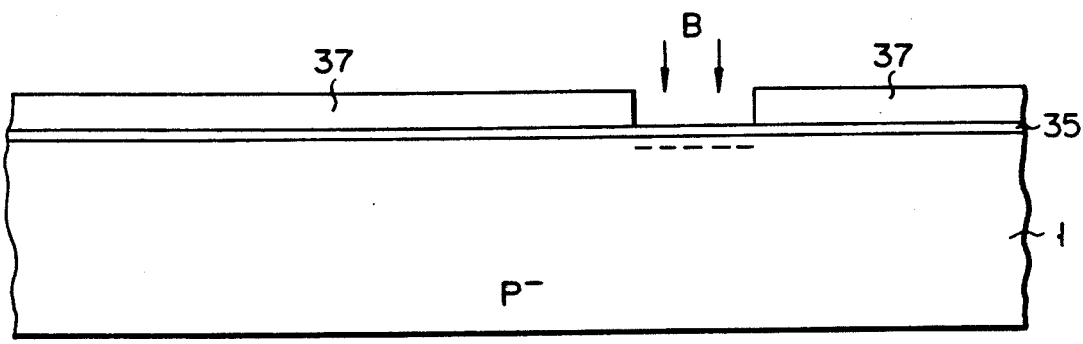
F I G. 3C

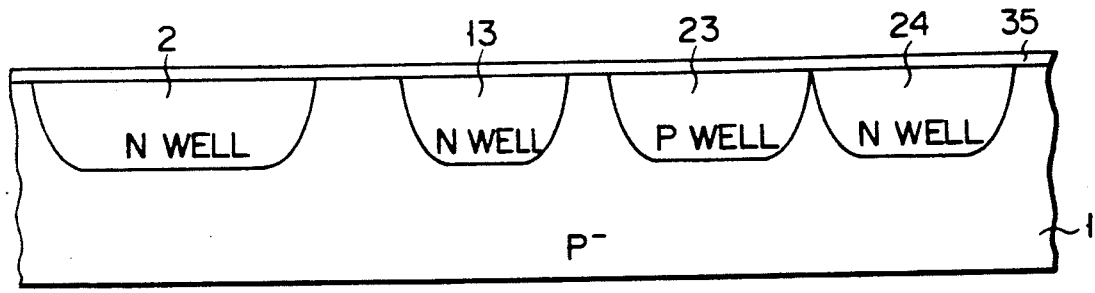
F I G. 3D
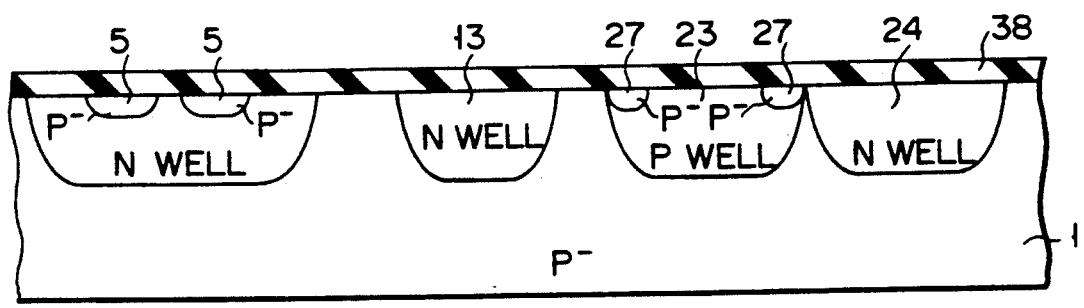
F I G. 3E
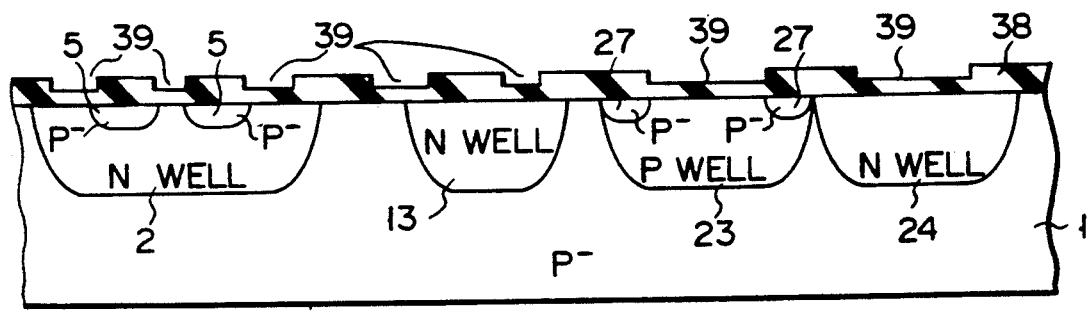
F I G. 3F
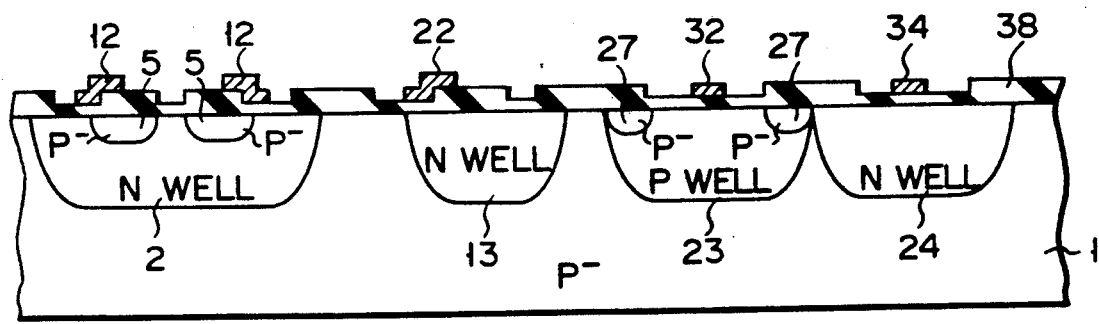
F I G. 3G

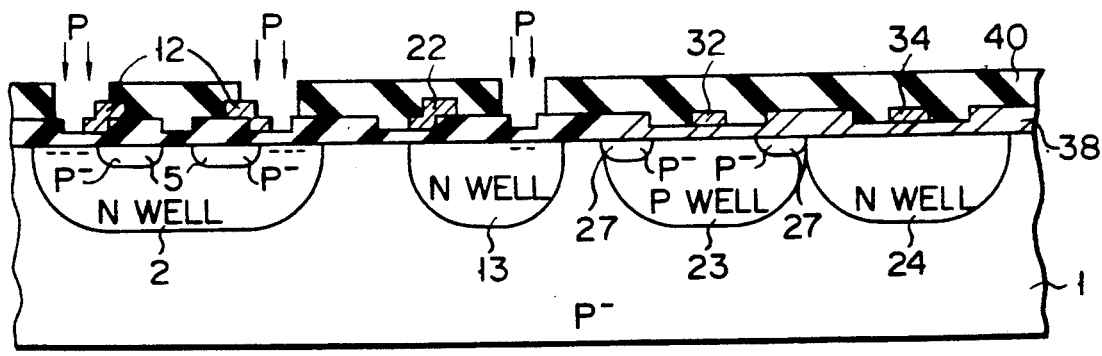
F I G. 3H
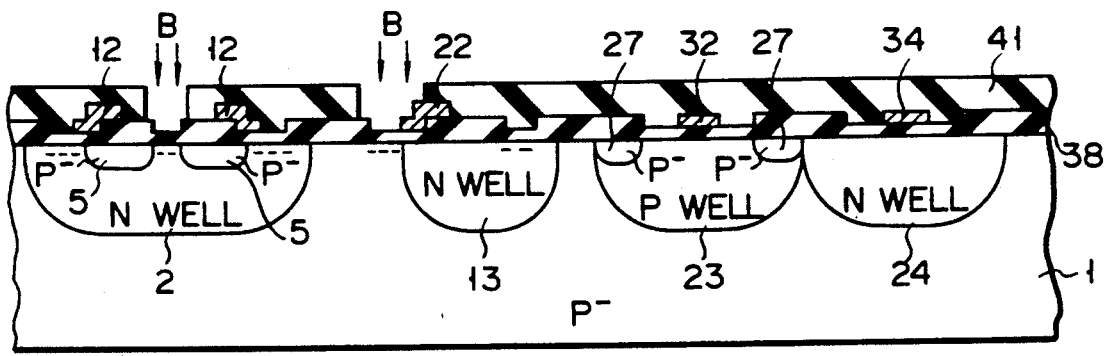
F I G. 3I
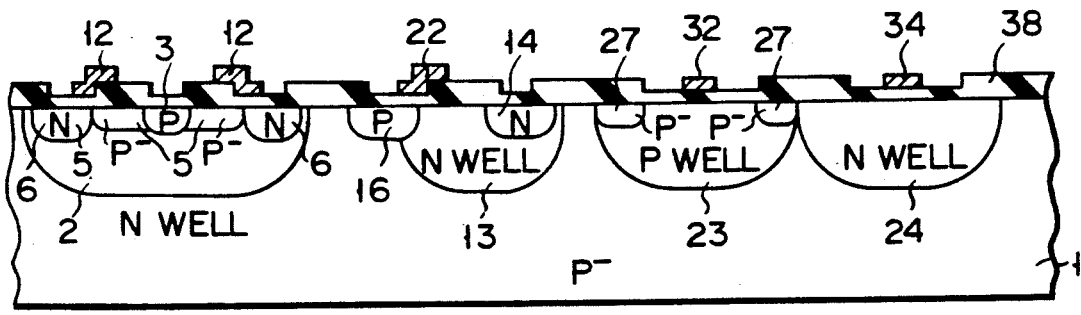
F I G. 3J
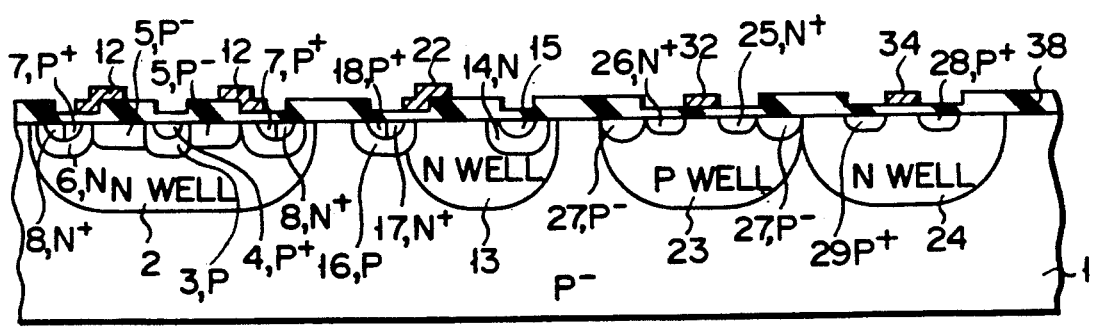
F I G. 3K

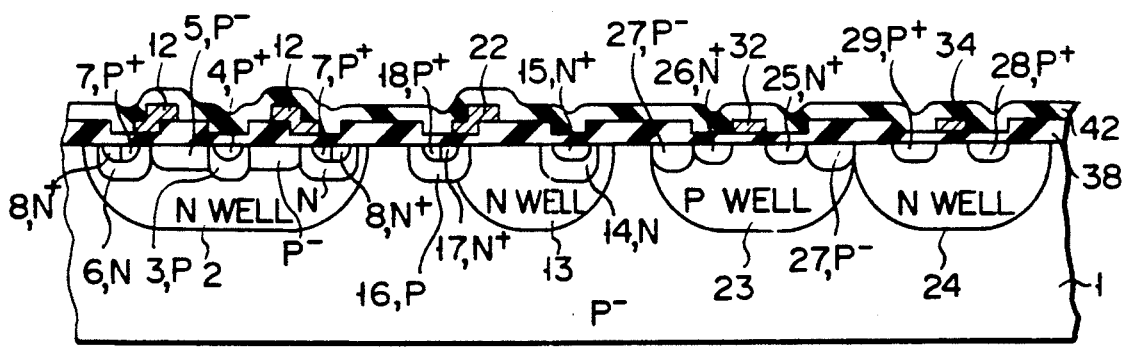
F I G. 3L
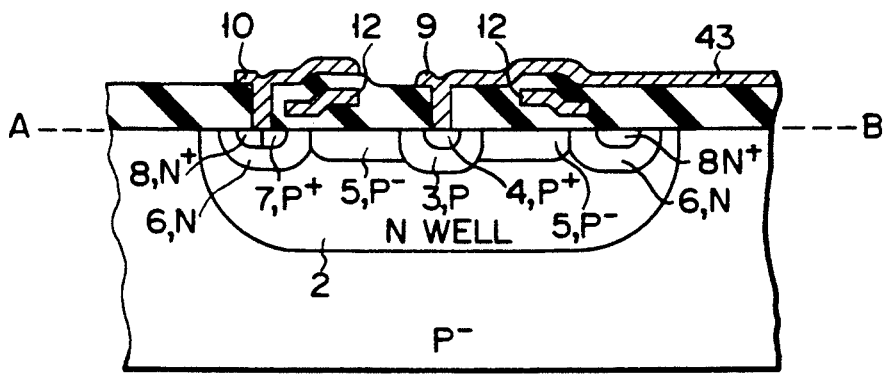
F I G. 4A
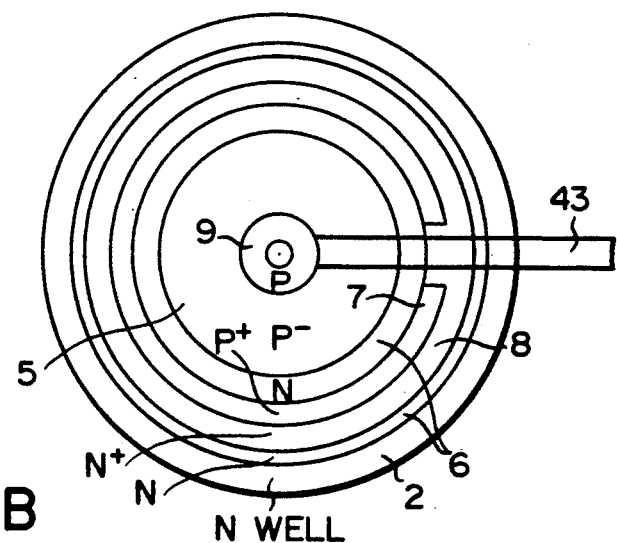
F I G. 4B

MOS TRANSISTOR WITH HIGH BREAKDOWN VOLTAGE

This application is a continuation of application Ser. No. 07/491,084, filed Mar. 9, 1990, now abandoned.

BACKGROUND OF THE INVENTION

1. Field of the Invention

The present invention relates to a semiconductor device and, more particularly, to a structure of a MOS transistor having a high breakdown voltage.

2. Description of the Related Art

An example of the structure of a cross section of a conventional N-channel MOS transistor having a high breakdown voltage will be described with reference to FIG. 5.

P-type well 50 is formed on the surface of P-type semiconductor substrate 1. N-type source region 51 and N-type drain region 52, each having a concentration which is higher than that of well 50, are spaced apart from each other in the respective portions near the surface of well 50. N-type impurity diffusion layer 53, whose concentration is higher than that of well 50 and lower than that of drain region 52, is formed in a portion near the surface of well 50 in contact with the wall of drain region 52, which is near source region 51, and to substantially the same depth as that of drain region 52. Gate electrode 55 is formed directly on a channel region between diffusion layer 53 and source region 51 in well 50 through insulation layer 54. In a P-channel MOS transistor, as illustrated in FIG. 7, it is necessary only to set well 46, drain region 47, source region 56 and impurity diffusion layer 57 in a conductive state opposite to that of the N-channel MOS transistor.

A vertical MOS transistor is used as a transistor requiring a breakdown voltage which is higher than that of the above-mentioned MOS transistor. An example of the structure of a cross section of the vertical MOS transistor is shown in FIG. 6. In FIG. 6, N-type buried layer 58 of high impurity concentration is formed in the surface of P-type semiconductor substrate 1 of low impurity concentration. N-type epitaxial layer 59 whose impurity concentration is lower than that of buried layer 58 is formed on the surfaces of substrate 1 and buried layer 58. Deep N-layer 60 having a concentration which is higher than that of epitaxial layer 59 and lower than that of buried layer 58, is formed from the end portion of buried layer 58 to the surface of epitaxial layer 59. P-type back gate layer 61 serving as a channel region is formed in a portion near the surface of epitaxial layer 59 surrounded by deep N-layers 60 and along deep N-layer 60. N-type source region 62 and P-type diffusion layer 63 each having a concentration which is higher than that of back gate layer 61, are formed in P-type back gate layer 61. Drain region 64, whose concentration is higher than that of deep N-layer 60, is formed in the surface portion of deep N-layer 60. Gate electrode 66 is formed directly on back gate layer 61 so as to interpose insulation layer 65 therebetween. Isolation layers 67 for isolating elements are formed in the surroundings of deep N-layer 60 from the surface of epitaxial layer 59 to the surface of semiconductor substrate 1.

In the conventional N-channel MOS transistor shown in FIG. 5, a depletion layer, which is formed at a drain PN junction when a reverse bias (drain voltage: +[V], gate voltage: 0[V], source voltage: 0[V]) is applied between the drain and source regions, has a shape shown by broken lines. The expansion of the depletion layer towards the channel region is more suppressed in a region between drain region 52 and well 50 where diffusion layer 53 of low concentration is formed than in a region where drain region directly contacts well 50. However, since the impurity concentration of diffusion layer 53 is higher than that of well 50, the depletion layer expands to the channel region and a high voltage is easily applied to insulation layer 54 directly under gate electrode 55. For this reason, the insulation breakdown voltage of insulation layer 54 is equal to the breakdown voltage of the MOS transistor and it is thus difficult to use the MOS transistor with a voltage which is higher than the breakdown voltage of insulation layer 54. If insulation layer 54 is thickened, its breakdown voltage can be increased, but a parasitic capacity becomes large and an operation speed becomes high. Taking this problem into consideration, a breakdown voltage of at most 40 V can be obtained in this MOS transistor.

If a reverse bias is applied to the vertical MOS transistor shown in FIG. 6 whose breakdown voltage is much higher than that of the above-mentioned MOS transistor, the depletion layer at the drain P-N junction does not expand so widely toward the channel region and a high breakdown voltage can thus be obtained since the impurity concentration of epitaxial layer 59 in the drain region is lower than that of back gate layer 61. However, this vertical MOS transistor requires the formation of Deep N-layer 60 serving as a drain region, thereby increasing an element in area. Furthermore, since epitaxial layer 59 is used in the drain region, it needs to be isolated from other elements. After isolation layer 67 is formed, an element must be formed therein. Since isolation layer 67 needs to deeply expand from epitaxial layer 59 to semiconductor substrate 1, the width of isolation layer 67 on the surface of epitaxial layer 59 is considerably large. When the thickness of epitaxial layer 59 is set to about 6 μm which is substantially the same as that of a well layer of the present invention mentioned later, the width of isolation layer 67 is about 12 μm which is twice as large as that of epitaxial layer 59. The width and depth of the isolation layer are very difficult to control and cannot be made constant. For this reason, the isolation layer is usually formed so as to have a space in an element-forming region and thus the element area is further enlarged, which prevents an improvement in the packed density.

SUMMARY OF THE INVENTION

It is an object of the present invention to provide a semiconductor device which improves a packed density and enables a low current consumption, a high-speed operation, and a high breakdown voltage.

According to one aspect of the present invention, there is provided a semiconductor device comprising: a semiconductor substrate (1) of a first conductivity type; a first well (2) of a second conductivity type formed on the semiconductor substrate (1); a first impurity diffusion layer (5) of the first conductivity type formed on the well (2) without contacting said semiconductor substrate (1); a second impurity diffusion layer (6) of the second conductivity which surrounds the first impurity diffusion layer (5) and has an impurity concentration which is higher than that of the first impurity diffusion layer (5) a third impurity diffusion layer (7) of the first conductivity type formed within the second impurity diffusion layer (6) so as to contact neither the semiconductor substrate (1) nor the first impurity diffusion layer (5); a source electrode (10) connected to both the second impurity diffusion layer (6) and the third impurity diffusion layer (7); a gate electrode (12) which is formed between the first impurity diffusion layer (5) and the third impurity diffusion layer (7) and formed on the second impurity diffusion layer 6 so as to interpose an insulation film (11) therebetween; a drain electrode (9) connected to the first impurity diffusion layer (5); and wiring layer (43) which is extracted from said drain electrode (9) outside the semiconductor substrate (1) and under which the third impurity diffusion layer is not formed.

In the semiconductor device according to the present invention, since the second impurity diffusion layer (6) of the second conductivity type has an impurity concentration which is higher than that of the first impurity diffusion layer (5), it is not influenced by the drain electrode and thus its shape is not changed by an applied high voltage. Therefore, the semiconductor device having a high breakdown voltage can be achieved.

Since the second impurity diffusion layer (6) is so constructed as to surround the first impurity diffusion layer (5), an area of the second impurity diffusion (6) can sufficiently be ensured and an element area can be reduced.

According to another aspect of the present invention, since the impurity concentration of a second island region (13) is lower than that of an impurity diffusion layer (16), a depletion layer does not extend so widely toward the impurity diffusion layer (16) when a reverse bias is applied. An electric field does not easily concentrate on the second impurity diffusion layer (6).

Since the second island region (13) is used as an active region for elements, the element construction is simplified. It is thus unnecessary to form an isolation layer for isolating the elements, so that the entire device can be greatly miniaturized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a cross-sectional view showing a semiconductor device according to an embodiment of the present invention;

FIG. 1B is a cross-sectional view showing a semiconductor device according to another embodiment of the present invention;

FIG. 1C is a plan view showing a semiconductor device according to an embodiment of the present invention;

FIG. 2 is a cross-sectional view showing a semiconductor device according to still another embodiment of the present invention;

FIGS. 3A to 3B are views showing steps of manufacturing the semiconductor device;

FIG. 4A is a cross sectional view showing a P-channel MOS transistor of high breakdown voltage;

FIG. 4B is a plan view showing the P-channel MOS transistor;

DETAILED DESCRIPTION OF THE PREFERRED EMBODIMENTS

Figure 5:
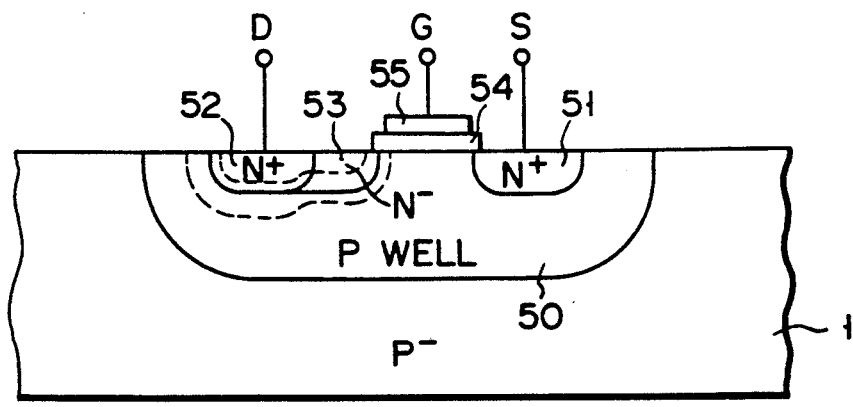
FIG. 5 is a cross-sectional view showing a conventional N-channel MOS transistor.
Figure 6:
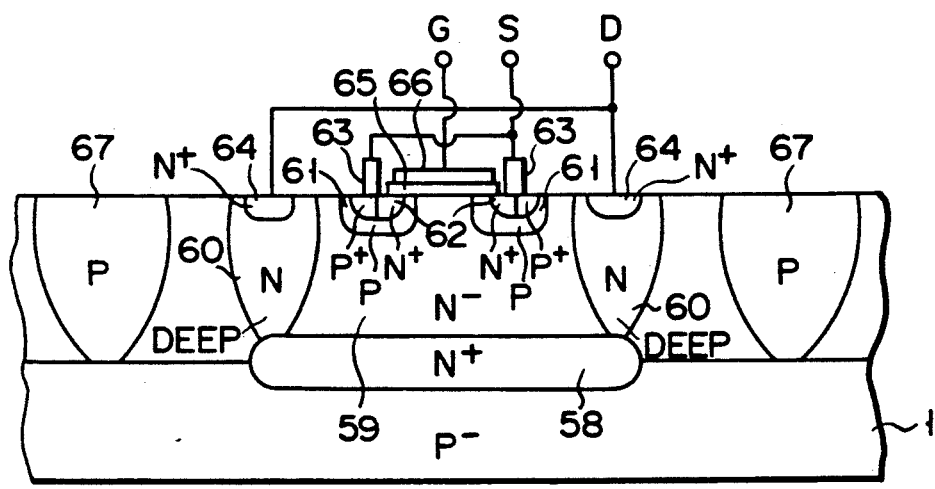
FIG. 6 is a cross-sectional view showing a conventional N-channel MOS transistor of a high breakdown voltage.

Embodiments of the semiconductor device according to the present invention will be described with reference to the accompanying drawings.

FIG. 1A is a cross-sectional view showing a semiconductor device according to an embodiment of the present invention; FIG. 1B is a cross-sectional view showing a semiconductor device according to another embodiment of the present invention; FIG. 1C is a plan view showing a semiconductor device according to an embodiment of the present invention.

In the embodiment shown in FIG. 1A, N-type island region 2 is formed on silicon semiconductor substrate 1 of a P-type conductivity, and first impurity diffusion layer 5 of a P type is formed on island region 2. Second impurity diffusion layer 6 of an N type having an impurity concentration which is higher than that of the first impurity diffusion layer (5) is formed so as to surround first impurity diffusion layer 5. Third impurity diffusion layer 7 of a P-type conductivity is formed on second impurity diffusion layer 6 so as not to contact first impurity diffusion layer 5. Drain electrode (first electrode) 9 is formed on first impurity diffusion layer 5, and source electrode (second electrode) 10 is formed on second impurity diffusion layer 6 and third impurity diffusion layer 7. Gate electrode (third electrode) 12 is formed on first impurity diffusion layer 5 and second impurity diffusion layer 6 through first insulation layer 11.

An explanation will be given of P-channel MOS transistor 100 of high breakdown voltage according to the embodiment shown in FIG. 1B and on the left side of FIG. 2. In this transistor, N-type first island region 2 whose impurity concentration is higher than that of P-type silicon substrate 1 is formed. P-type fifth impurity diffusion layer 3, which has a higher impurity concentration than that of first island region 2 and serves as a drain, is formed in the upper middle portion of first island region 2. P-type fourth impurity diffusion layer 4 whose impurity concentration is higher than that of fifth impurity diffusion layer 3 is formed in diffusion layer 3. P-type first impurity diffusion layer 5, which has a lower impurity concentration than that of first island region 2 and is shallower than first island region 2, is formed in contact with the side wall of first island region 2. Second impurity diffusion layer 6, which has a higher impurity concentration than that of first impurity diffusion layer 5, is deeper than layer 5 and serves as a back gate, contacts and surrounds first impurity diffusion layer 5. P-type third impurity diffusion layer 7 which has a higher impurity concentration than that of second impurity diffusion layer 6 and serves as a source, and N-type sixth impurity diffusion layer 8 for ohmic-contacting island region 2, second impurity diffusion layer 6 and source electrode 10 are formed in contiguity with each other in a portion near the surface of second impurity diffusion layer 6. Drain electrode (first electrode) is formed on P-type fourth impurity diffusion layer 4 formed in second impurity diffusion layer 3, and source electrode (second electrode) 10 is formed on third impurity diffusion layer 7 and N-type impurity diffusion layer 8. Gate electrode (third electrode) 12 is formed stepwise on first and second impurity diffusion layers 5 and 6 through first insulation layer 11. The thickness of gate electrode 12 over second impurity diffusion layer 6 is smaller than that of gate electrode 12 over first impurity diffusion layer 5.

An explanation will be given of N-channel MOS transistor 200 of high breakdown voltage which is formed in contiguity with P-channel MOS transistor 100 mentioned above. N-type second island region 13 whose impurity concentration is comparatively higher than that of P-type substrate 1 is formed on substrate 1. N-type diffusion layer 14 which has a much higher impurity concentration than that of second island region 13 and serves as a drain is formed in a portion near the surface of region 13. N-type diffusion layer 15 whose impurity concentration is much higher than that of diffusion layer 14 is formed in layer 14. P-type impurity diffusion layer 16, which has a higher impurity concentration than that of second island region 13 and serves as back gate of N-channel MOS transistor 200, is formed so as to cut into part of the side wall of second island region 13, which faces P-channel MOS transistor 100. N-type impurity diffusion layer 17, which has a higher impurity concentration than that of impurity diffusion layer 16 and serves as a source electrode of N-channel MOS transistor 200, and P-type impurity diffusion layer 18 for ohmic-contacting substrate 1 and P-type impurity diffusion layer 16, are formed in contiguity with each other in a portion near the surface of impurity diffusion layer 16. Drain electrode (fourth electrode) 19 is formed on N-type impurity diffusion layer 15 whose impurity concentration is high, and source electrode (fifth electrode) 20 is formed on impurity diffusion layer 17 and P-type impurity diffusion layer 18. Gate electrode (sixth electrode) 22 is formed stepwise on impurity diffusion layer 16 and second island region 13 through third insulation layer 21. The thickness of gate electrode 22 over impurity diffusion layer 16 is smaller than that of gate electrode 22 over second island region 13.

An explanation will be given of N- and P-channel MOS transistors 300 and 400 of low breakdown voltage formed on the same substrate of the foregoing N-channel MOS transistor of high breakdown voltage. P-type fourth island region 23 and N-type third island region 24 are formed on the surface of P-type substrate 1. N-type drain diffusion layer 25 and source diffusion layer 26, whose impurity concentrations are each higher than that of fourth island region 23, are formed apart from each other in the upper portions of fourth island region 23. P-type impurity diffusion layers 27 whose impurity concentrations are each lower than that of fourth island region 23, are formed in contiguity with diffusion layers 25 and 26, respectively to prevent an erroneous operation due to a parasitic MOS transistor on the opposite surface of fourth island region 23 to the channel region. P-type drain diffusion layer 28 and source diffusion layer 29, whose impurity concentrations are each higher than that of third island region 24 are formed apart from each other in the upper portions of fourth island region 24. In N-channel MOS transistor 300, drain and source electrodes 30 and 31 are formed directly on drain and source diffusion layers 25 and 26, respectively, and gate electrode 32 is formed directly on the channel region through the insulation layer. In P-channel MOS transistor 400, drain and source electrodes 49 and 33 are formed directly on drain and source diffusion layers 28 and 29, respectively, and gate electrode 34 is formed directly on the channel region through the insulation layer.

FIGS. 3A to 3L show an example of a method for manufacturing a semiconductor device so constructed. P-type silicon substrate 1 whose impurity (boron) concentration is $1\times10^{15}$ cm$^3$ is thermally oxidized in the steam atmosphere of 1000° C. to form oxide film 35 having a thickness of 1000 Å on the surface of substrate 1 (FIG. 3A). First photoresist pattern 36, which has openings where first, second and third island regions 2, 13 and 24 are to be formed, is formed on oxide film 35 by the photo-etching technique, and phosphorus is ion-implanted in the openings (FIG. 3B). First photoresist pattern 36 is removed, second photoresist pattern 37, which has an opening where fourth island region 23 is to be formed, is formed, and boron is ion-implanted in the opening (FIG. 3C). After second photoresist pattern 37 is removed, the remaining portion is treated for ten hours in the N$_2$ atmosphere of 1200° C. to form first N-well (first island region) 2 whose impurity concentration is $1\times10^{15}$ cm$^3$, width is 100 μm and depth is 8 μm, second N-well (second island region) 13 whose impurity concentration is $1\times10^{15}$ cm$^3$, width is 60 μm and depth is 8 μm, N-type third island region 24, and P-type fourth island region 23 (FIG. 3D). A photoresist pattern, which has openings where first impurity diffusion layer 5 of P-channel MOS transistor 100 of high breakdown voltage and P-type diffusion layer 27 for a channel stopper of N-channel MOS transistor 300 of low breakdown voltage are to be formed, is formed, and boron having an impurity concentration of $1\times10^{17}$ cm$^{-3}$ is ion-implanted in the openings. The photoresist pattern is then removed and the surface of the remaining structure is oxidized again in the steam atmosphere of 1000° C. to form oxide film 38 having a thickness of 1 μm (FIG. 3E). Only electrode forming region 39 in oxide film 38 is removed by the photo-etching technique. The remaining structure is thermally treated in the O$_2$ atmosphere of 1000° C. to form first and third insulation layers 11 and 21 each having a thickness of 1000 Å and gate insulation films of P-channel and N-channel MOS transistors 400 and 300 of low breakdown voltage (FIG. 3F). Polycrystalsilicon having a thickness of 0.5 μm is deposited on the surface of the oxide film by the CVD technique, and a portion other than gate electrodes 12, 22, 32 and 34 is removed (FIG. 3G). Third photoresist pattern 40, which has openings where second impurity diffusion layer 6 of P-channel MOS transistor 100 of high breakdown voltage and N-type second impurity diffusion layer 6 of N-channel MOS transistor 200 of high breakdown voltage are formed, is formed, and phosphorus having an impurity concentration of $2\times10^{17}$ cm$^{-3}$ is ion-implanted in the openings (FIG. 3H). Similarly, fourth photoresist pattern 41, which has openings where fifth impurity diffusion layer 3 of P-channel MOS transistor 100 and impurity diffusion layer 16 of N-channel MOS transistor 200 are formed, is formed, and boron having an impurity concentration of $5\times10^{17}$ cm$^{-3}$ is ion-implanted in the openings (FIG. 3I). The structure is subjected to thermal treatment for an hour in the N$_2$ atmosphere of 1200° C. to form second impurity diffusion layer 6, N-type diffusion layer 14, fifth impurity diffusion layer 3 and impurity diffusion layer 16 (FIG. 3J). A photoresist pattern is formed again, and only regions of the photoresist pattern for forming sixth impurity diffusion layer 8 for connecting source electrode 10 of P-channel MOS transistor 100 of high breakdown voltage and second impurity diffusion layer 6, impurity diffusion layer 17 serving as a source of N-channel MOS transistor 200 of high breakdown voltage, and drain and source diffusion layers 25 and 26 of N-channel MOS transistor 300 of low breakdown voltage, are removed, and arsenic having an impurity concentration of $1 \times 10^{20}$ cm$^3$ is ion-implanted. The photoresist pattern is removed, and another photoresist pattern, which has openings where third impurity diffusion layer 7 of P-channel MOS transistor 100 of high breakdown voltage, P-type fourth impurity diffusion layer 4 of high impurity concentration, P-type diffusion layer 18 for ohmic-contacting source electrode 20 of N-channel MOS transistor 200 of high breakdown voltage and impurity diffusion layer 16, and drain and source diffusion layers 28 and 29 of P-channel MOS transistor 400 of low breakdown voltage are formed, is formed and boron having an impurity concentration of $1 \times 10^{20}$ cm$^3$ is ion-implanted in the openings. After the photoresist pattern is removed, the remaining structure is annealed for thirty minutes in the N$_2$ atmosphere of 1000° C. to form the above-mentioned layers (FIG. 3K). Further, SiO$_2$ layer 42 of 1 $\mu$m in thickness is deposited on the surface of the annealed structure by the CVD technique, and the structure is annealed again for ten minutes in the O$_2$ atmosphere of 1000° C. (FIG. 3L). After that, contact holes are formed by the photo-etching technique in regions where first, second, fourth and fifth electrodes 9, 10, 19 and 20, and source and drain electrodes 33, 49, 31, 30 of N-channel and P-channel MOS transistors 400 and 300 of low breakdown voltage are to be formed, and an Al film of 1 $\mu$m in thickness is deposited and patterned, thereby forming a semiconductor device having the structure shown in FIG. 2.

Figure 7:
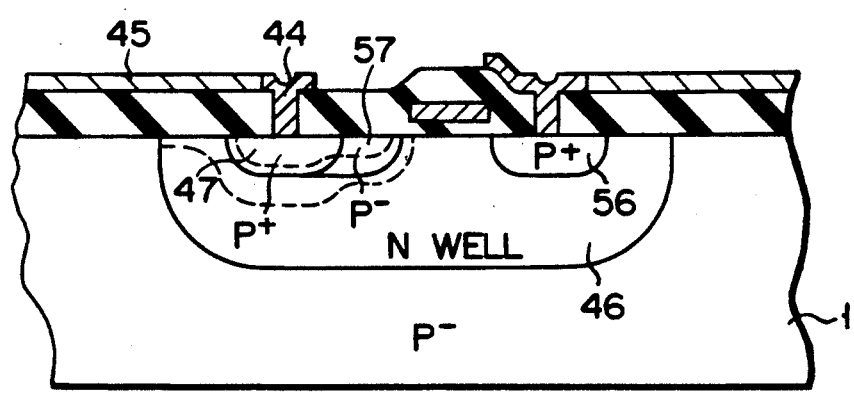
FIG. 7 is a cross-sectional view showing a conventional P-channel MOS transistor.

According to the embodiment shown in FIG. 2, in P-channel MOS transistor 100 of high breakdown voltage, fifth impurity diffusion layer 3 serving as a drain is formed in the middle of first island region 2. Layer 3 is surrounded by second impurity diffusion layer 6 serving as an N-type back gate whose impurity concentration is higher than that of P-type first impurity diffusion layer 5 serving as a back gate through first impurity diffusion layer 5. P-type third impurity diffusion layer 7 of high impurity concentration is formed in second impurity diffusion layer 6. Therefore, the depletion layer formed at the PN junction when a reverse bias is applied between the drain and source, expands toward first impurity diffusion layer 5 and does not expand so widely toward second impurity diffusion layer 6 since the impurity concentration of first impurity diffusion layer 5 is lower than that of second impurity diffusion layer 6. This structure protects the first insulation layer 11 from application of an electric field to the portion thereof between the second diffusion layer 6 and the gate electrode 12. Hence, this insulation layer may be made thinner. This permits the current driving capacity per gate voltage of an element to be improved and this area of the element can be advantageously reduced while maintaining a current of the same output. Therefore, the parasitic capacity of the element is decreased, the current consumption can be decreased, and the operation speed can be increased. Since third impurity diffusion layer 7 surrounds fifth impurity diffusion layer 3, the channel region of third impurity diffusion layer 7 can have a sufficient width and the integration density can be improved even if the element is reduced. The depletion layer, which opposes the channel region and is formed when a reverse bias is applied to the conventional P-channel type MOS transistor shown in FIG. 7 may extend to P-type semiconductor substrate 1 through N-type well 46 and a short circuit may occur between drain layer 47 and substrate 1 since, if drain wiring layer 45 connected to drain electrode 44 crosses directly over the depletion layer, drain wiring layer 45 functions like a gate electrode. In the structure of the present invention, however, fifth impurity diffusion layer 3 serving as a drain is surrounded by the channel region through first impurity diffusion layer 5, so that N-type first island region 2 contacts the drain (fifth impurity diffusion layer 3) only at the bottom of fifth impurity diffusion layer 3 and an influence due to the wiring can be neglected, thereby preventing the above-mentioned problem from being caused.

According to the structure of the present invention mentioned above, a MOS transistor of a low power consumption, a high-speed operation, a large current driving capacity and a high breakdown voltage, can be obtained. As shown in FIGS. 4A and 4B, drain electrode extracting portion 43 of transistor 100 crosses and deletes source electrode 10 formed directly under drain electrode extracting portion 43 and P-type third impurity diffusion layer 7 serving as a source, and N-type sixth impurity diffusion layer 8 used for an ohmic contact is formed in these regions. Neither third impurity diffusion layer 7 serving as a source nor second impurity diffusion layer 6 serving as a back gate is influenced by drain electrode 9 and an element having stable characteristics can thus be achieved.

In N-channel MOS transistor 200 of high breakdown voltage according to the embodiment shown in FIG. 1A, N-type second island region 13 is used as part of the drain, and P-type impurity diffusion layer 16 for back gate, whose impurity concentration is higher than that of second island region 13 is formed so as to extend into part of island region 13. Even though a reverse bias is applied between the source and drain, the depletion layer does not extend toward impurity concentration 16 and second impurity diffusion layer 13. Therefore, since an electric field applied to third insulation layer 21 formed directly on impurity diffusion layer 17 is suppressed, it is possible to reduce the thickness of third insulation layer 21 formed directly on impurity diffusion layer 16 where a channel layer is to be formed, and to enlarge the current driving capacity per gate voltage and reduce the area of an element while a current maintaining of the same output. For this reason, the parasitic capacity of the element is decreased, the current consumption can be reduced and the operation speed can be increased. When the conventional MOS transistor is formed in contiguity with another element, an isolation layer for isolating the elements is required. In the MOS transistor of the present invention, second island region 13 and impurity diffusion layer 16, whose conductivity types differ from each other, are formed next to each other in the upper portion of P-type semiconductor substrate 1. If the conductivity type of an element next to MOS transistor 200 is opposite to that of MOS transistor 200, no isolation layer needs to be formed therebetween. The packing density of elements can thus be increased.

When the aforementioned P-channel MOS transistor 100 of high breakdown voltage, N-channel MOS transistor 300 of low breakdown voltage and P-channel MOS transistor 400 are formed on the same substrate as that of the MOS transistor according to the present invention, since N-type well (second island region) 13 is used as a drain, N-channel MOS transistor 200 of the present invention can be manufactured with the same mask as used when a well of P-channel MOS transistor 400 is formed, which simplifies the manufacturing process and is effective in forming a bipolar transistor on a single substrate. Conventionally, the source and drain of an N-channel MOS transistor were formed directly on the surface of a substrate. As shown in FIG. 1, however, the semiconductor device of the present invention is so constructed that N-channel MOS transistor 300 of low breakdown voltage i surrounded by P-type well (fourth island region) 23. Therefore, the concentration of the substrate can be freely set and thus optimized to increase the breakdown voltage of the element.

The foregoing embodiment is limited to a MOS transistor of one conductivity type. However, the same effects can be obtained in a MOS transistor of another conductivity type.

As described above, according to the present invention, the packing density is improved, and a low current consumption, a high speed operation and a high breakdown voltage can be achieved.

Additional advantages and modifications will readily occur to those skilled in the art. Therefore, the invention in its broader aspects is not limited to the specific details, representative devices, and illustrated shown and described herein. Accordingly, various modifications may be made without departing from the spirit or scope of the general inventive concept as defined by the appended claims and their equivalents.

What is claimed is:

1. A semiconductor device comprising:
    a semiconductor substrate of a first conductivity type;
    a plurality of wells of a second conductivity type formed in said semiconductor substrate;
    a plurality of FET structure each having a drain electrode, with each of said structures formed in a different one of said wells; and
    a wiring layer extracted from said drain electrode outside said semiconductor substrate;
    wherein at least one of said FET structure includes:
        a first impurity diffusion layer of the first conductivity type formed in said one of said wells without contacting said semiconductor substrate;
        a second impurity diffusion layer of the second conductivity type which surrounds said first impurity diffusion layer and has an impurity concentration higher than that of said well;
        a third impurity diffusion layer of the first conductivity type formed within said second impurity diffusion layer without contacting said semiconductor substrate and said first impurity diffusion layer, said third impurity diffusion layer being ring-shaped and having a gap therein through which said wiring layer extends;
        a source electrode connected to both said second impurity diffusion layer and said third impurity diffusion layer;
        a gate electrode formed between said first impurity diffusion layer and said third impurity diffusion layer and formed on said second impurity diffusion layer so as to interpose an insulation film therebetween; and
        a drain electrode connected to said first impurity diffusion layer.

2. The semiconductor device according to claim 1, further comprising a fourth impurity diffusion layer connected to said drain electrode, formed in said third impurity diffusion layer and having an impurity concentration which is higher than that of said third impurity diffusion layer.

3. The semiconductor device according to claim 2, further comprising a fifth impurity diffusion layer surrounding said fourth impurity diffusion layer without contacting said second impurity diffusion layer and having an impurity concentration which is higher than that of said third impurity diffusion layer and lower than that of said fourth impurity diffusion layer.

4. The semiconductor device according to claim 3, further comprising a sixth impurity diffusion layer of a second conductivity type surrounding said third impurity diffusion layer and having an impurity concentration which is higher than that of said second impurity diffusion layer, one end of said sixth impurity diffusion layer extending under one end of said gate electrode under said wiring layer.

5. The semiconductor device according to claim 1, wherein said insulation film has a thick portion under said gate electrode and toward a side of said drain electrode.

6. The semiconductor device according to claim 1, further comprising:
    a MOS FET of a second conductivity channel type; and
    a MOS FET formed next to said MOS FET and on said semiconductor substrate.

7. The semiconductor device according to claim 6, further comprising a fourth impurity diffusion layer connected to said drain electrode, formed in said third impurity diffusion layer and having an impurity concentration which is higher than that of said third impurity diffusion layer.

8. The semiconductor device according to claim 7, further comprising a fifth impurity diffusion layer surrounding said fourth impurity diffusion layer without contacting said second impurity diffusion layer and having an impurity concentration which is higher than that of said third impurity diffusion layer and lower than that of said fourth impurity diffusion layer.

9. The semiconductor device according to claim 8, further comprising a sixth impurity diffusion layer of a second conductivity type surrounding said third impurity diffusion layer and having an impurity concentration which is higher than that of said second impurity diffusion layer, one end of said sixth impurity diffusion layer extending under one end of said gate electrode under said wiring layer.

10. The semiconductor device according to claim 6, wherein said insulation film has a thick portion under said gate electrode and toward a side of said drain electrode.

11. The semiconductor device according to claim 6, further comprising a MOSFET of a second conductivity channel type and of a low breakdown voltage formed on said semiconductor substrate.

12. The semiconductor device according to claim 6, further comprising a MOSFET of a first conductivity channel type and of a low breakdown voltage formed on said semiconductor substrate.

13. The semiconductor device according to claim 1, wherein said first conductivity type is a P-type.

14. The semiconductor device according to claim 1, wherein said first conductivity type is an N-type.

* * * * *

UNITED STATES PATENT AND TRADEMARK OFFICE
CERTIFICATE OF CORRECTION

PATENT NO. : 5,191,401
DATED : March 02, 1993
INVENTOR(S) : Koji Shirai et al.

It is certified that error appears in the above-indentified patent and that said Letters Patent is hereby corrected as shown below:

Claim 1, column 9, line 42, change "structure" to -- structures --.

Claim 1 column 9, line 47, change "structure" to --structures--.

Signed and Sealed this

Twenty-second Day of February, 1994

BRUCE LEHMAN

Attest:

Attesting Officer

Commissioner of Patents and Trademarks